(12) United States Patent
Lopatinsky et al.

(10) Patent No.: US 6,903,928 B2
(45) Date of Patent: Jun. 7, 2005

(54) INTEGRATED CROSSFLOW COOLER FOR ELECTRONIC COMPONENTS

(75) Inventors: Edward Lopatinsky, San Diego, CA (US); Saveliy Rosenfeld, San Diego, CA (US); Lev Fedoseyev, El Cajon, CA (US); Daniel Schaefer, Palm Desert, CA (US)

(73) Assignee: Rotys Inc., San Diego, CA (US)

( * ) Notice: Subject to any disclaimer, the term of this patent is extended or adjusted under 35 U.S.C. 154(b) by 190 days.

(21) Appl. No.: 10/459,822

(22) Filed: Jun. 11, 2003

(65) Prior Publication Data

US 2003/0231468 A1 Dec. 18, 2003

Related U.S. Application Data

(60) Provisional application No. 60/388,230, filed on Jun. 13, 2002.

(51) Int. Cl.[7] .................................................. H05K 7/20
(52) U.S. Cl. ...................... 361/697; 165/86.3; 165/121; 165/185; 415/53.1; 415/119; 361/703; 257/722
(58) Field of Search ................................ 165/80.3, 121, 165/122, 185; 361/687, 694–697, 703; 415/53.1, 178, 119, 175; 454/184; 257/722

(56) References Cited

U.S. PATENT DOCUMENTS

| 3,702,918 A | * | 11/1972 | Moller ........................ 392/369 |
| 6,047,765 A | * | 4/2000 | Zhan .......................... 165/80.3 |
| 6,210,101 B1 | * | 4/2001 | Horng ........................ 415/53.1 |
| 6,698,505 B2 | * | 3/2004 | Lopatinsky et al. ........ 165/122 |
| 6,700,781 B2 | * | 3/2004 | Chia-Kuan et al. ......... 361/697 |

* cited by examiner

*Primary Examiner*—Gregory Thompson

(57) ABSTRACT

An integrated crossflow cooler for electronic components comprises a heatsink with at least two openings, a crossflow blower and an electric drive with a stator and a magnetized rotor. The heatsink comprises a base and heat exchanging means; the base provides thermal contact with the electronic component and the heat exchanging means. The crossflow blower hydraulically connected to one of the openings and comprises a casing rigidly built-in to the heatsink and a drum type impeller comprises magnetic means and serves as a magnetized rotor of the electric drive. The stator made as printed circuit board and rigidly built-in to the casing. The integrated crossflow cooler comprises two types of electric drives—when the magnetic means magnetized in the direction parallel to the axis of rotation and when the magnetic means magnetized in the direction perpendicular to the axis of rotation.

6 Claims, 27 Drawing Sheets

INTEGRATED CROSSFLOW COOLER FOR ELECTRONIC COMPONENTS

CROSS-REFERENCE TO RELATED APPLICATIONS

The present application claims the benefit of priority of U.S. Provisional Patent Application Ser. No. 60/388,230, filed Jun. 13, 2002 for Edward Lopatinsky at al. the entire content of which is incorporated herein by reference.

BACKGROUND OF THE INVENTION

The present invention relates generally to cooling systems. More particularly, the present invention relates to cooling systems for regulating the temperature of electronic components of electronic devices. The present invention is particularly, but not exclusively, useful for a cooling system for regulating the temperature of electronic components of blade servers.

The regulation of the temperature of electronic components like processors due to heat generated inside the housing of an electronic device like a blade server is an important consideration during the design of an electronic device. Cooling is important because if left unchecked, heat can cause electronic devices to malfunction during use or lead to premature device failure. As improvements in processor size and speed occur, the amount of heat generated by the larger and faster processors also increases. Additionally, improved processors require larger power supplies and auxiliary components that generate increased amounts of heat require improved systems for heat removal.

Another factor that aggravates the need for improved heat removal cooling systems is the trend towards making computing devices such as blade server smaller and especially thinner. The trend toward smaller and thinner electronic devices having larger, faster processors renders the traditional heat removal cooling systems inadequate for several reasons. First, smaller devices having faster processors result in an increased density of heat producing electronic components leading to higher localized concentrations of heat. Also, a decreased amount of space is available for localized temperature regulating devices such as traditional heatsinks. Lastly, a decreased amount of space is available to create ventilation paths that pass by heat sources. Thus, traditional blower assemblies having an inlet from above the blower that ventilate the entire housing of the device are less effective or inapplicable in removing heat when used in smaller, thinner devices.

There are numerous design of cooling systems for electronic device that include a blower assisted heatsink located directly at the electronic component. These conventional coolers had been using axial or radial blower mostly. But, in spite of relative high blower efficiency at regular size of axial and radial blowers, the blower efficiency drop down dramatically when these blowers have been used for relative small size cooling systems.

To overcome such problem there are some conventional coolers that had been using a crossflow blower assisted heatsink. The crossflow blowers have one special feature— blower efficiency is not depend on blower size, therefore the crossflow blower efficiency is significant larger than axial or radial blower ones when using at cooler design. Therefore, the crossflow blower cooler could deliver more air at other equal conditions and has larger thermal efficiency in comparison with conventional axial or radial blower coolers.

It is known cooler for electronic devices that uses crossflow fan (see U.S. Pat. No. 6,227,286 FIGS. 15A–15C and 40A–40C). At this design a crossflow fan axis located perpendicularly to cooler surface that connected to an electronic component. Using this type fan gives the possibility to suck and discharge air at the sides of the fan; therefore the thickness of the apparatus can be reduced. But, the design described in this invention doesn't have high fan efficiency because there is a hub inside a fan impeller where a fan motor is located.

The closest analogue to the invention being claimed is crossflow cooling device for semiconductor components that uses crossflow fan with an axis located parallel to cooling device surface that contacted to a semiconductor component (see U.S. Pat. No. 6,047,765). This device needs an electric drive mounted at a shaft outside of an impeller, therefore increasing dimensions of the cooling device.

Thus, the main problem arise when using the crossflow blower assisted heatsink—on the one hand the placing of the electric drive inside of the blower impeller leads to sufficient decreasing of the blower and thermal efficiency, and on other hand the placing of the electric drive outside of the blower impeller leads to sufficient increasing in size.

Thus, it would be generally desirable to provide an apparatus that overcomes this problem associated with crossflow blower assisted heatsink devices, and has a relatively high blower and thermal efficiency without the need of increasing the volume.

BRIEF SUMMARY OF THE INVENTION

According to the present invention an integrated crossflow cooler for electronic components comprises a heatsink with at least two openings, a crossflow blower and an electric drive with a stator and a magnetized rotor.

The general idea of the claimed invention is that an impeller of the crossflow blower comprises magnetic means and could serve as the magnetized rotor of the electric drive. Simultaneously, the stator of the electric drive could be made as printed circuit board and be rigidly attached to the heatsink. Thus, the integrated crossflow cooler for electronic components realized as an integrated structure where the magnetized rotor of the electric drive is integrated with the impeller of the blower, and the stator of the electric drive is integrated with the heatsink. Therefore, on one hand there is no electric drive inside of the impeller thus provides high blower and thermal efficiency of the cooler; also, there is no volumetric electric drive outside of the impeller thus provides smaller size of the cooler.

In order to achieve these objectives, the heatsink comprises a base and upstanding heat exchanging means, the base provides thermal contact with the electronic component and heat exchanging means which could be made as fins and/or pins. The crossflow blower hydraulically connected to one of the openings and comprises a casing rigidly built-in to the base and a drum type impeller. The drum type impeller comprises circumferential arrayed blades rigidly mounted with two faces disks and could comprise at least one interim ring. The casing of the crossflow blower forms hydraulic part of the blower and serves for blower' parts mounting.

The integrated crossflow cooler for electronic components according to the present invention may comprise two types of electric drives—first type, when the magnetic means magnetized in the direction parallel to the axis of rotation and the second one—when the magnetic means magnetized in the direction perpendicular to the axis of rotation. Both of these two types electric drives could be used mutually or separate.

For the first type electric drive, the printed circuit board comprises circumferential arrayed coils mounted at the casing and located around the axis of rotation and axes of the circumferential arrayed coils are parallel to the axis of rotation. In this case the magnetic means made as at least two blades and/or two faces disks both magnetized in the direction parallel to the axis of rotation.

Accordingly, for the second type electric drive the printed circuit board comprises at least two rows of linear arrayed coils mounted at the casing and located along the axis of rotation and axes of the linear arrayed coils are perpendicular to the axis of rotation. In this case the magnetic means made as at least two blades and/or at least one interim ring both magnetized in the direction perpendicular to said axis of rotation.

DETAILED DESCRIPTION OF THE INVENTION

Figure 1:
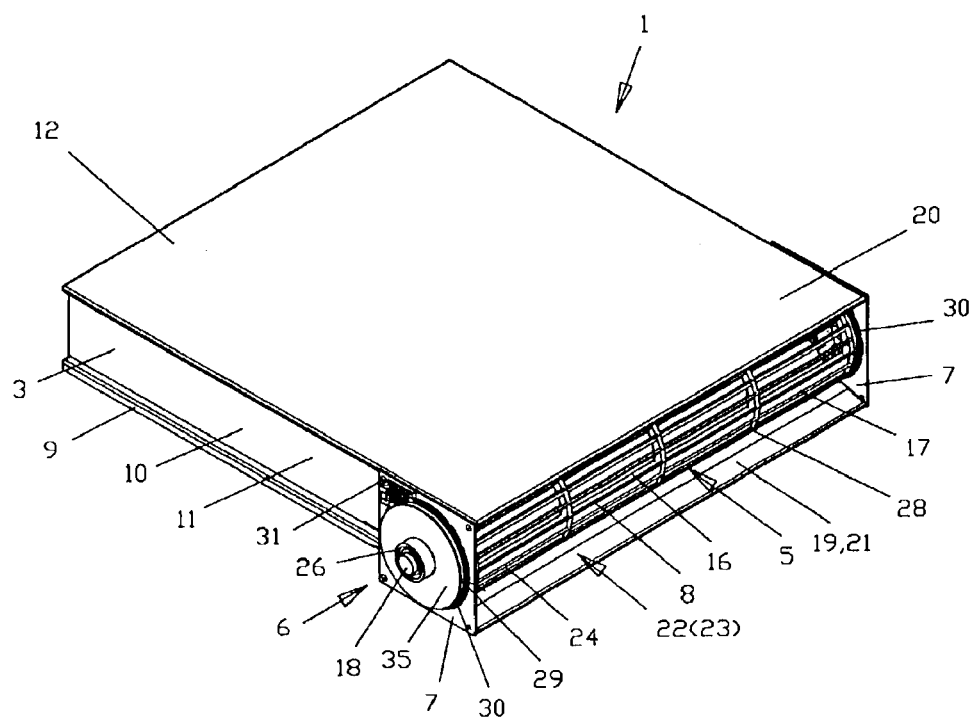
FIG. 1 is a perspective view showing the integrated crossflow cooler for electronic components.
Figure 1A:
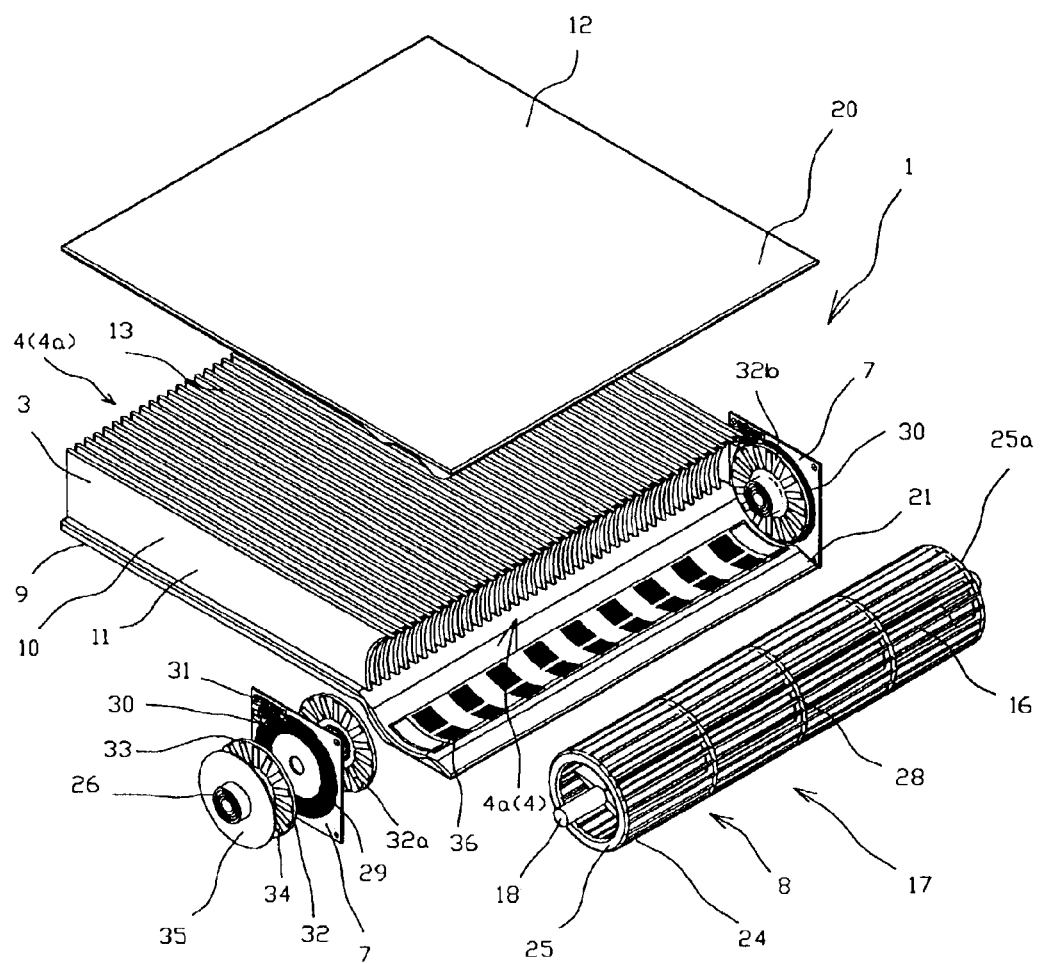
FIG. 1A is an exploded view showing the integrated crossflow cooler for electronic components.
Figure 2:
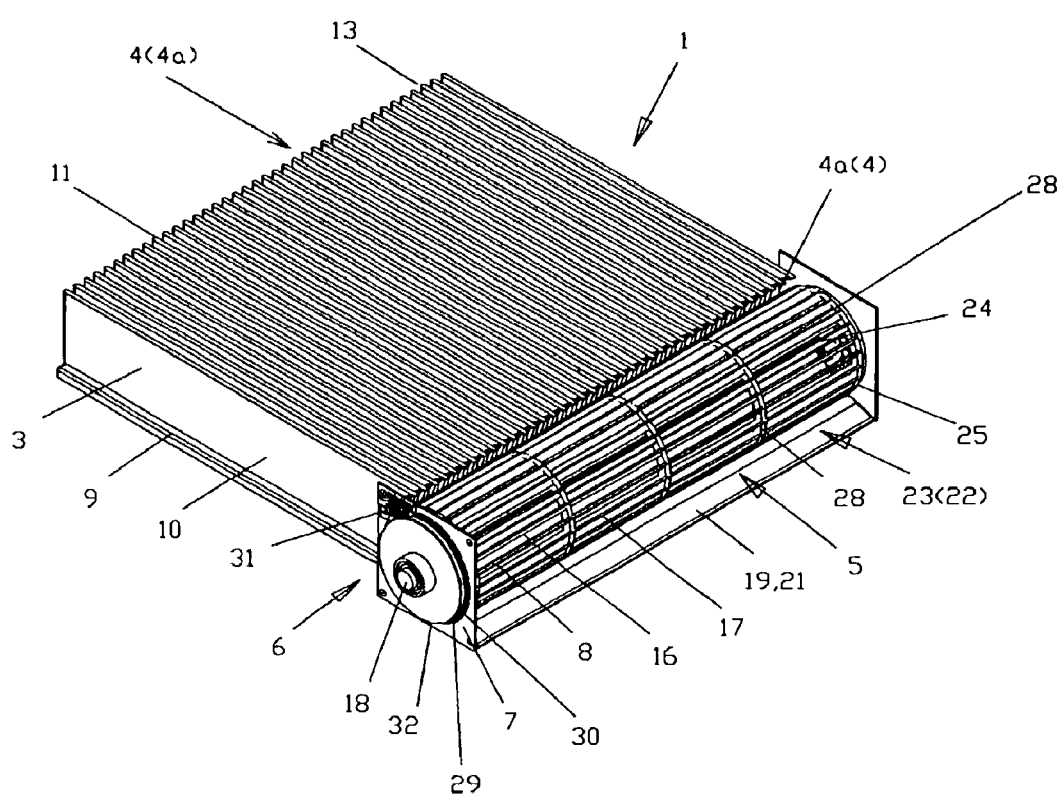
FIG. 2 is a perspective view showing the integrated crossflow cooler for electronic components without the cover plate of the heatsink.
Figure 3:
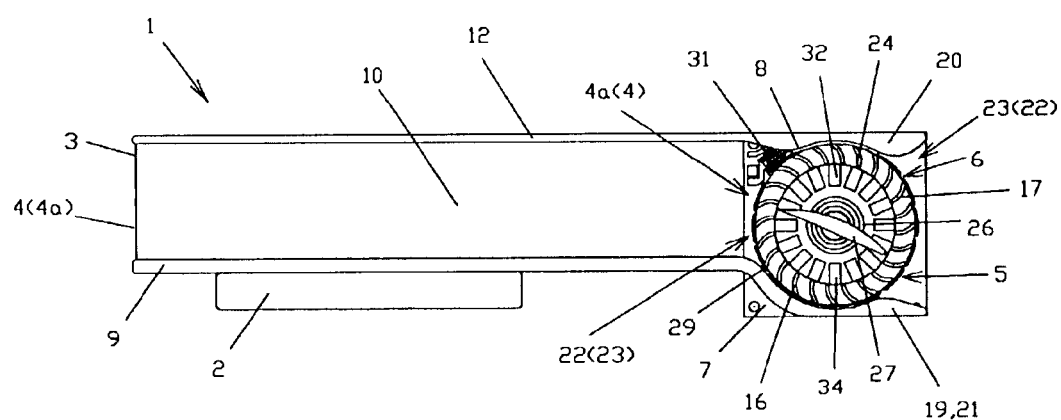
FIG. 3 is a sectional view of FIG. 1 along plane perpendicular to the axis of rotation showing the integrated crossflow cooler for electronic components when the first type electric drive comprises the circumferential arrayed coils.
Figure 4:
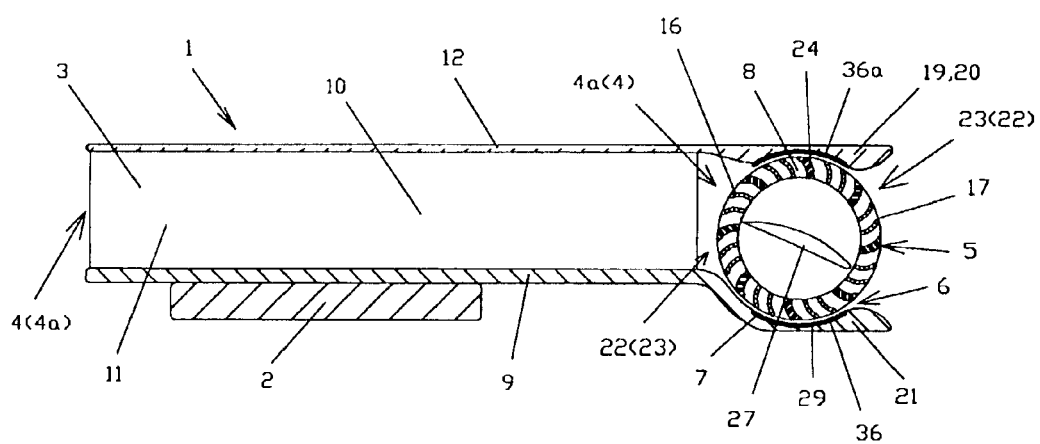
FIG. 4 is a sectional view of FIG. 1 along plane perpendicular to the axis of rotation showing the integrated crossflow cooler for electronic components when the second type electric drive comprises the linear arrayed coils.
Figure 5:
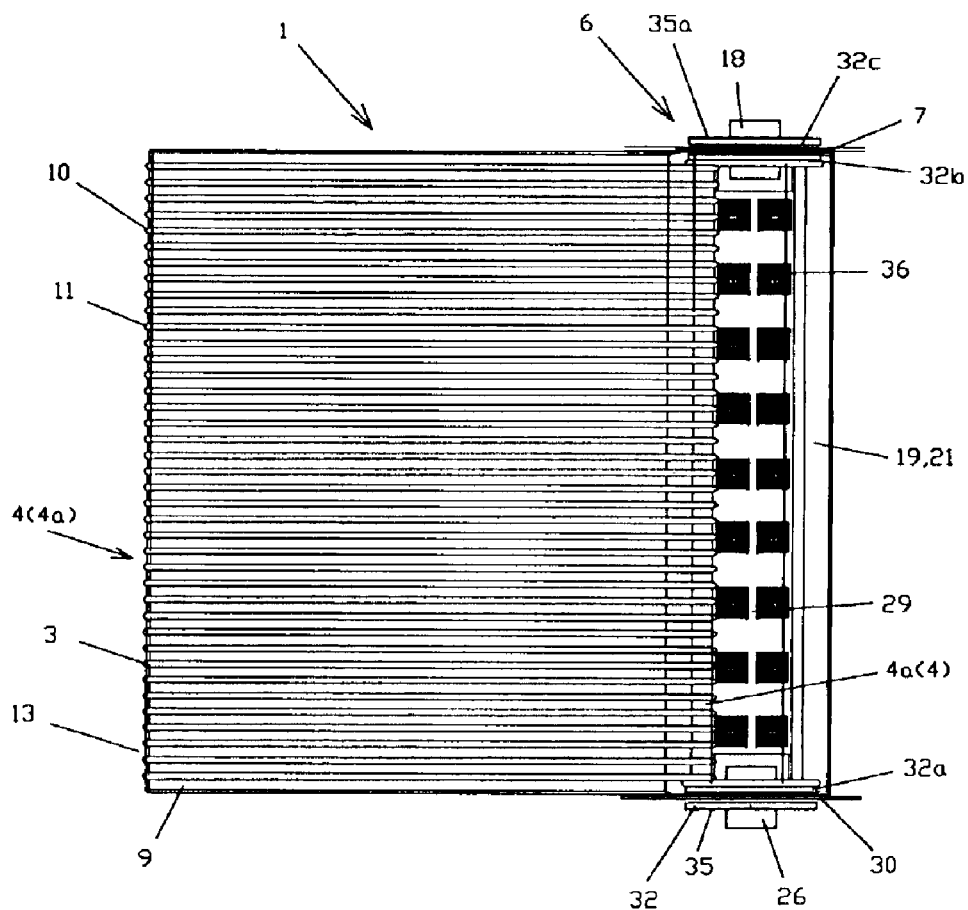
FIG. 5 is a top view of the integrated crossflow cooler for electronic components without the cover plate of the heatsink and the impeller.
Figure 6:
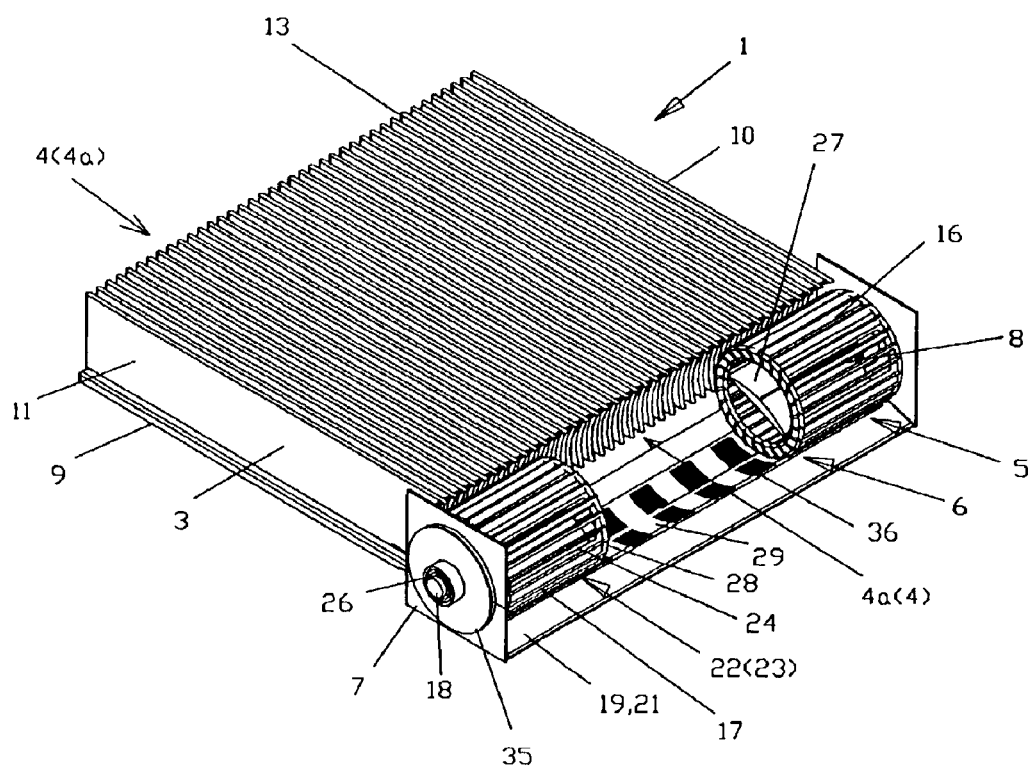
FIG. 6 is the same like FIG. 2 showing the integrated crossflow cooler for electronic components without the central part of the drum type impeller.
Figure 7:
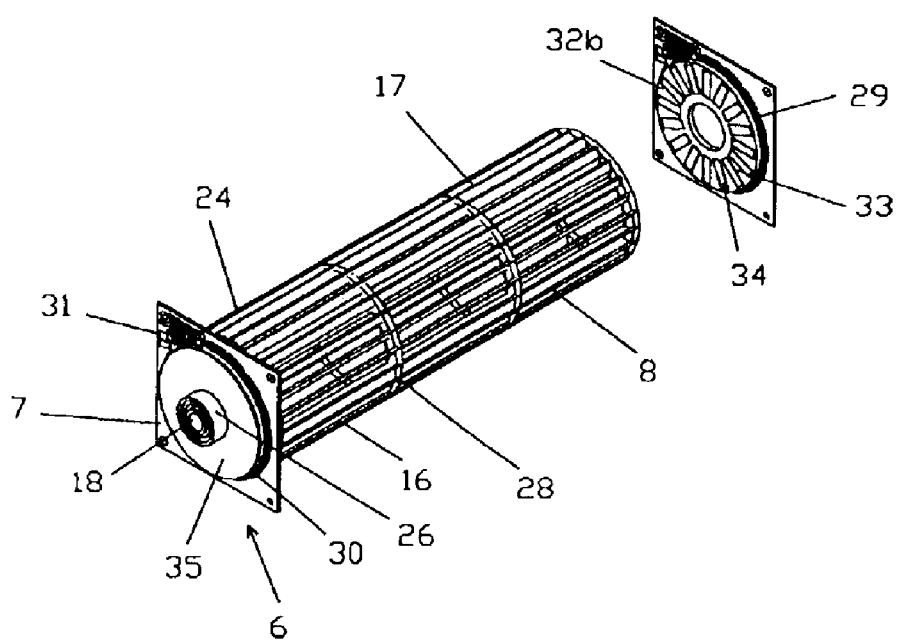
FIG. 7 is a perspective view showing the drum type impeller without right end part and the stator comprises the circumferential arrayed coils.
Figure 8:
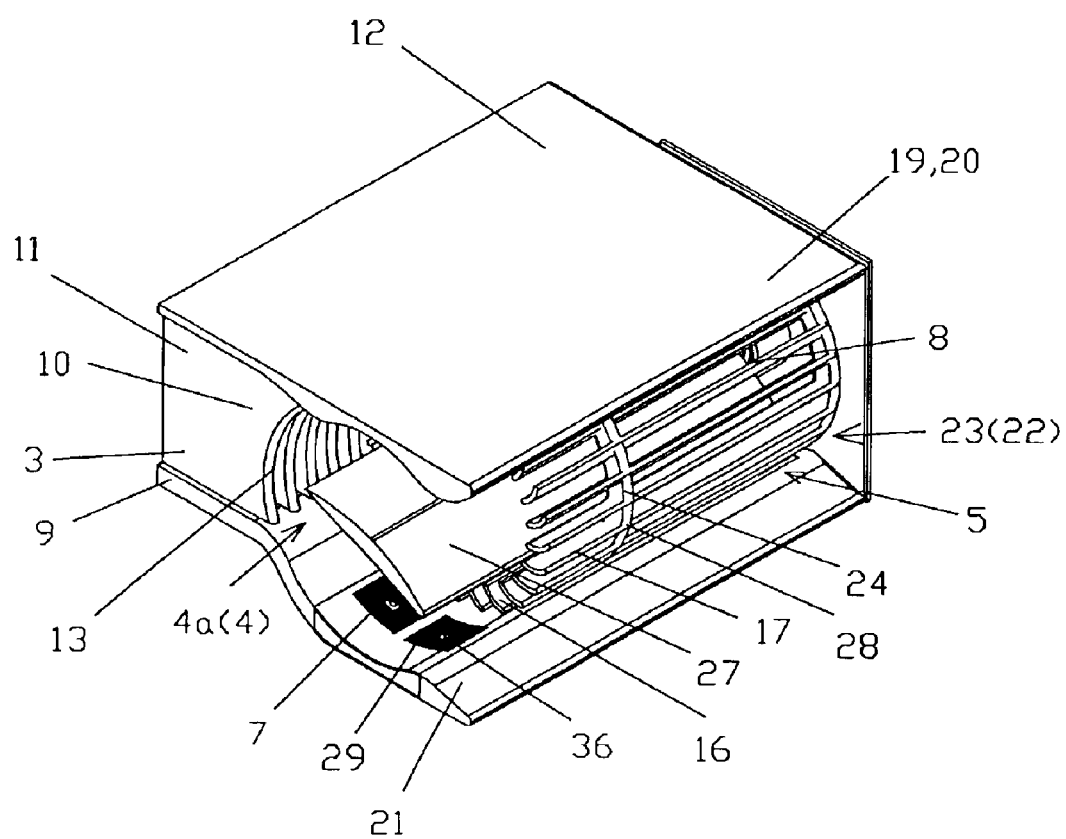
FIG. 8 is a partial view of FIG. 1 showing the part of the electric drive comprises the linear and circumferential arrayed coils, both.
Figure 9:
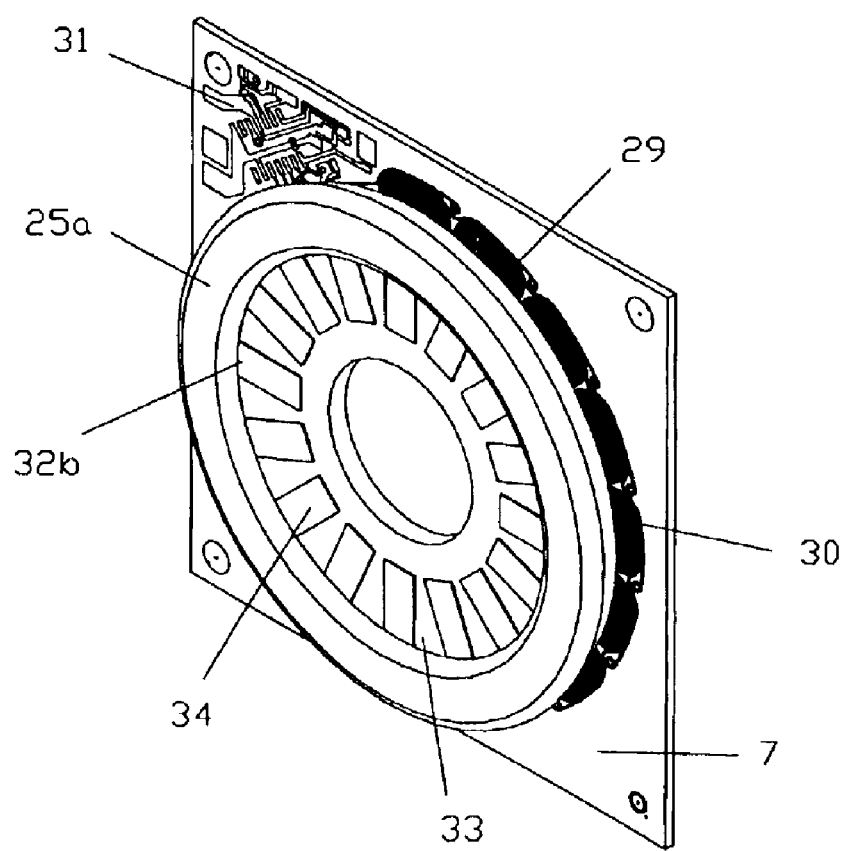
FIG. 9 is a partial view showing the part of the first type electric drive comprises the circumferential arrayed coils.
Figure 10:
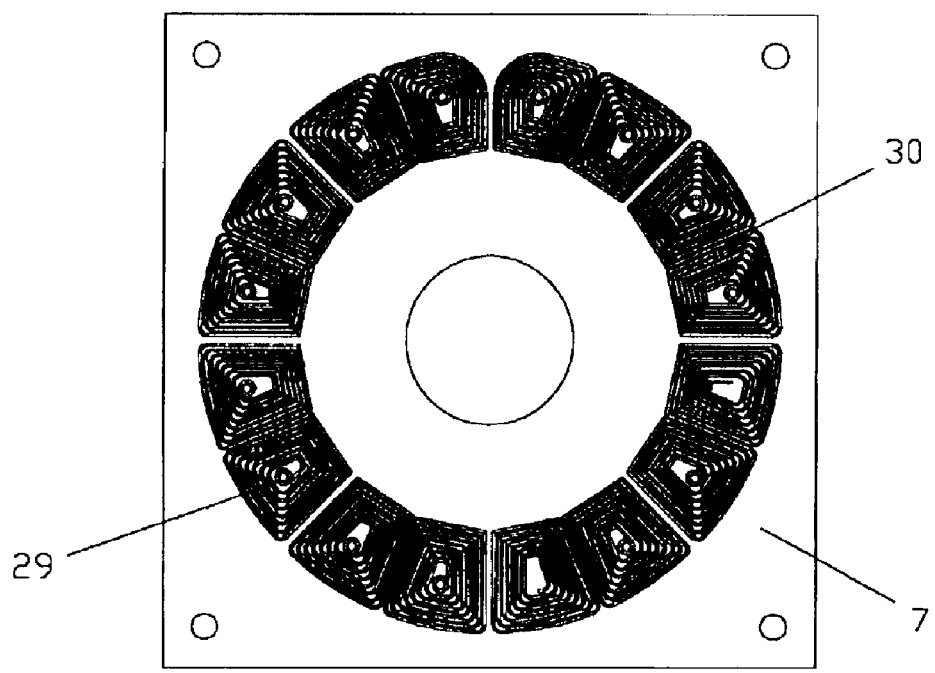
FIG. 10 is a front view of the stator comprises the circumferential arrayed coils.
Figure 11:
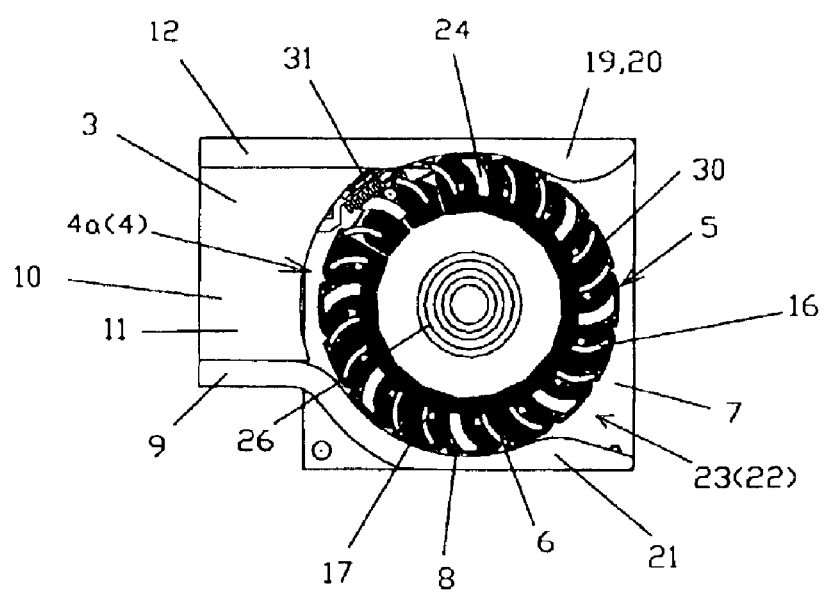
FIG. 11 is a sectional view of the casing; the stator comprises the circumferential arrayed coils and magnetic means like blades.
Figure 12:
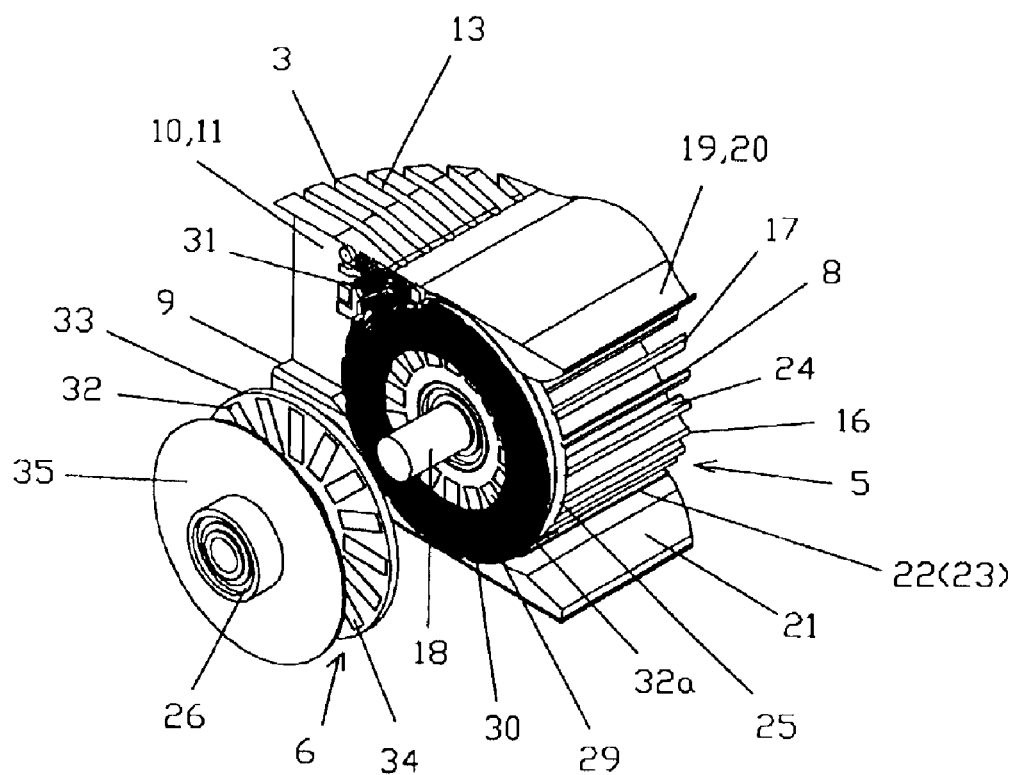
FIG. 12 is a partial exploded view showing the part of the first type electric drive comprises the circumferential arrayed coils.
Figure 13:
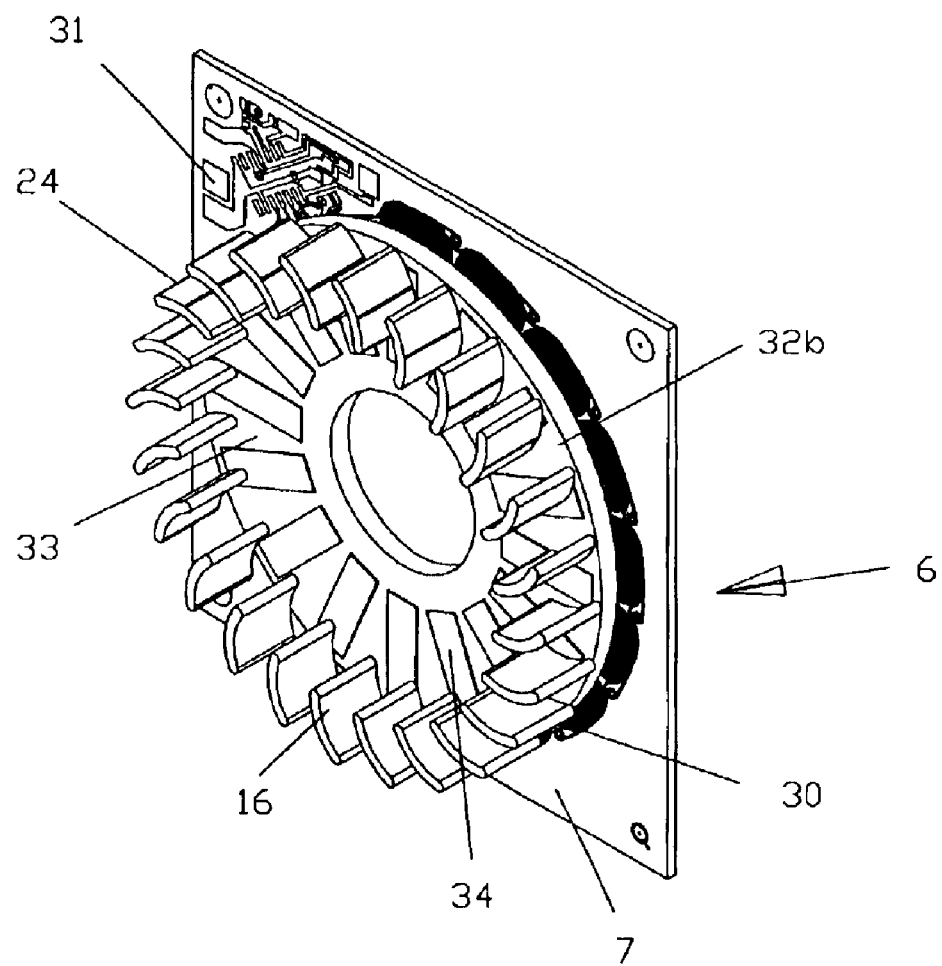
FIG. 13 is a partial perspective view showing the part of the drum type impeller and the first type electric drive comprises the circumferential arrayed coils.
Figure 14:
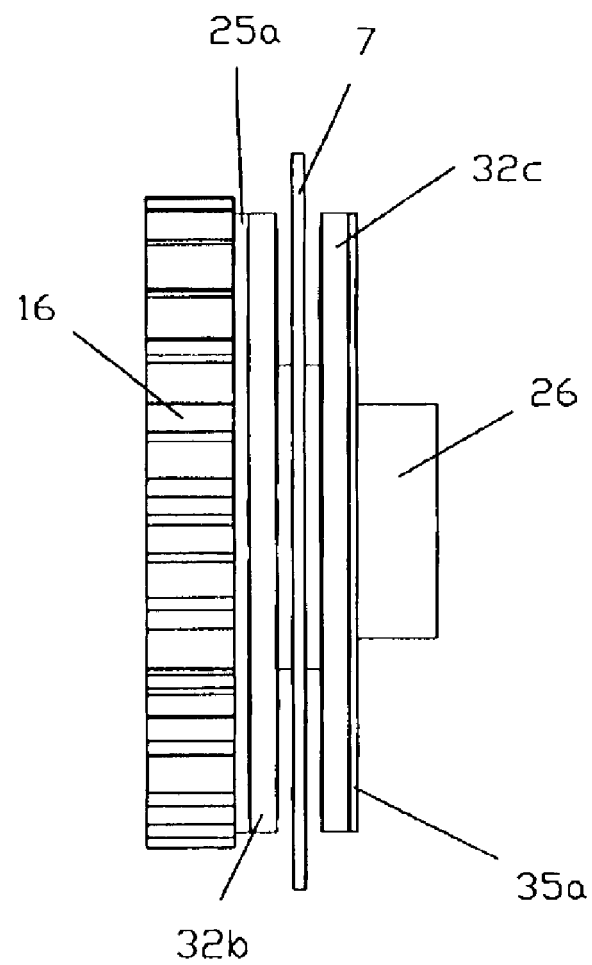
FIG. 14 is a side view of FIG. 13.
Figure 15:
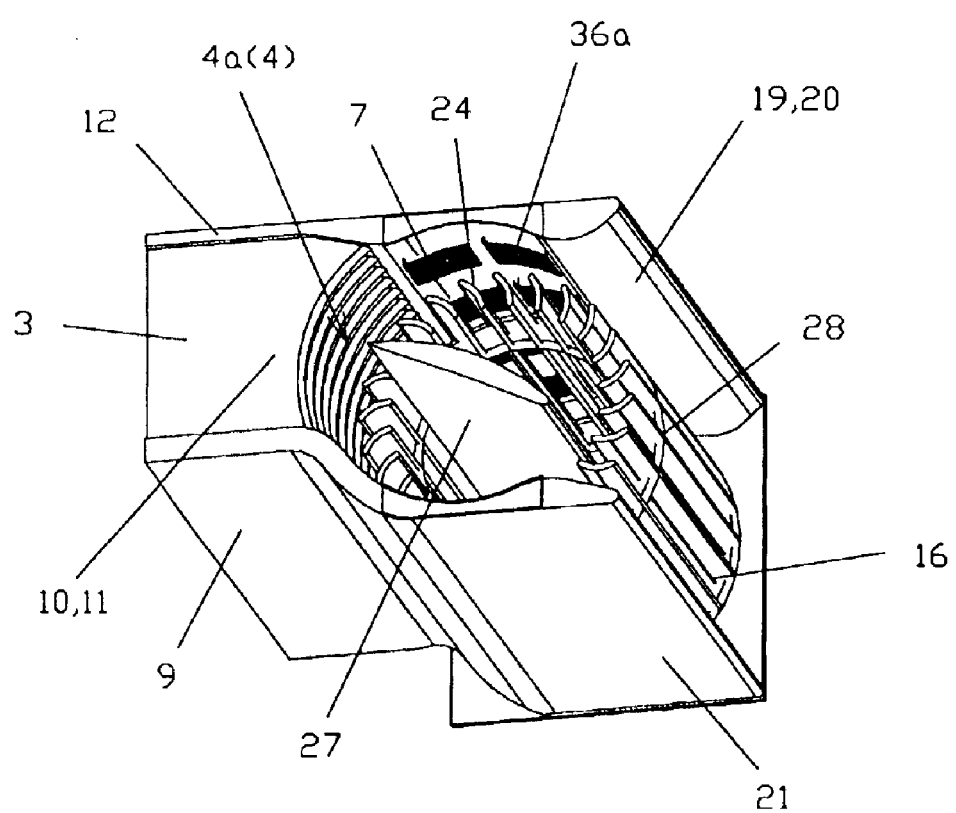
FIG. 15 is a different perspective view of FIG. 8.
Figure 16:
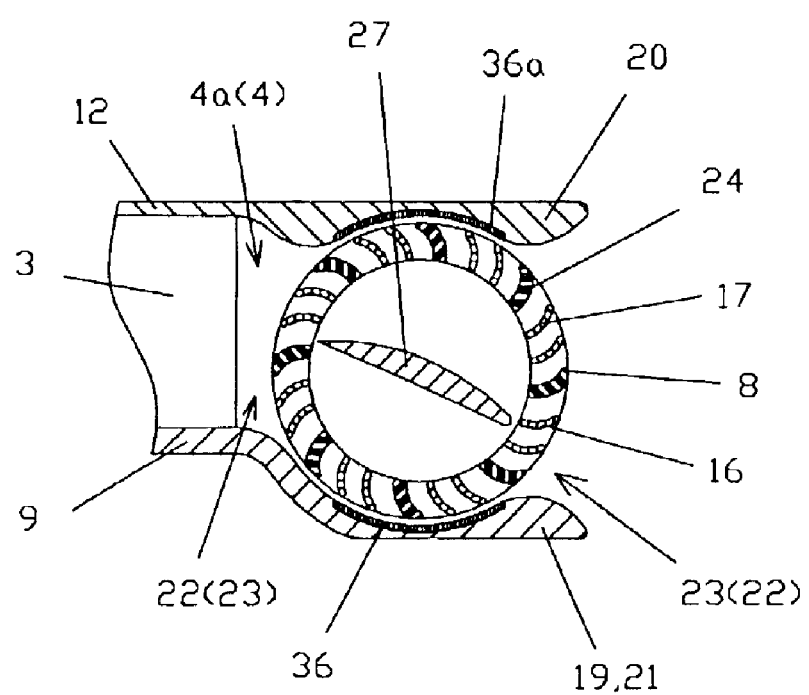
FIG. 16 is a partial enlarged view of FIG. 4 showing the second type electric drive comprises the linear arrayed coils and magnetic means like blades.
Figure 17:
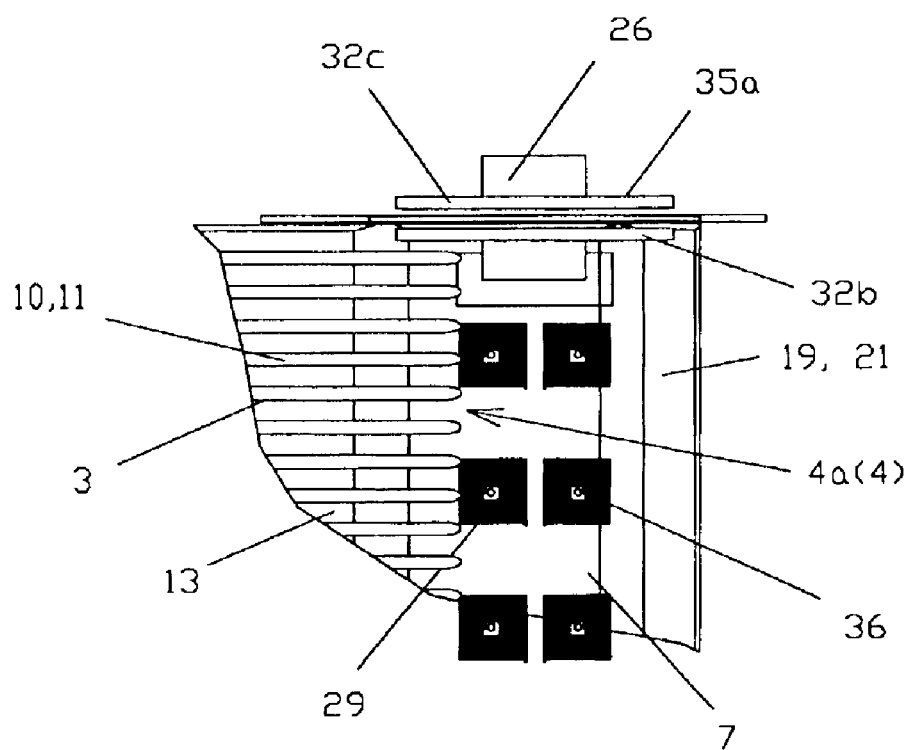
FIG. 17 is a partial enlarged top view of FIG. 5 showing part of the electric drive comprises linear and circumferential arrayed coils, both.
Figure 18:
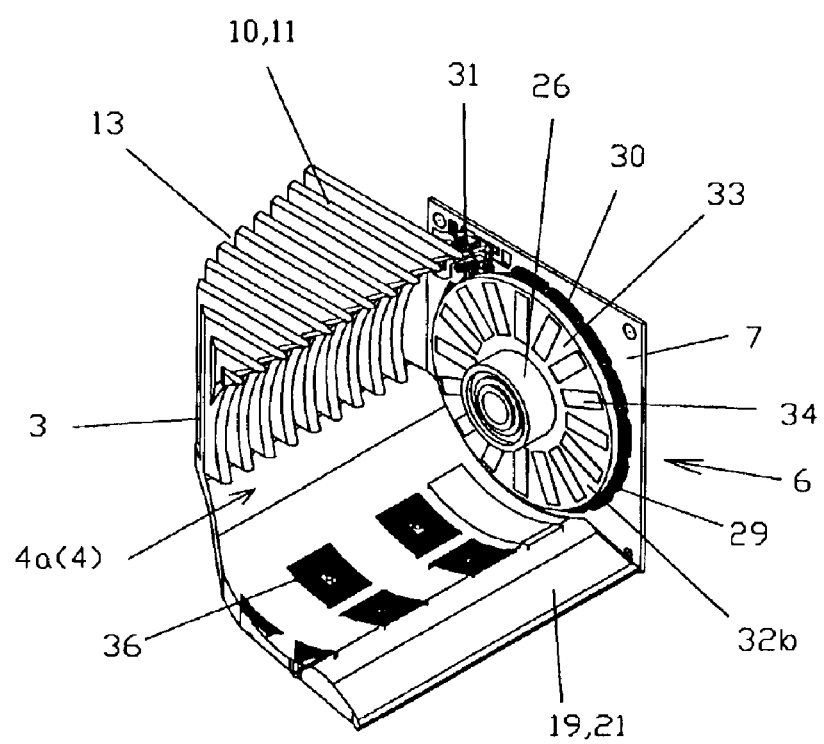
FIG. 18 is a partial perspective view of FIG. 1A showing the part of the electric drive comprises linear and circumferential arrayed coils, both.

Claimed invention will be described in detail below with reference to the accompanying drawings. FIGS. 1–26 show embodiments of the present invention.

The integrated crossflow cooler 1 (FIGS. 1–6) for electronic components 2 (FIGS. 3–4) comprises a heatsink 3 with at least two openings 4 and 4a (FIGS. 1A–6, 8, 11 and 15–18), a crossflow blower 5 and an electric drive 6 with a stator 7 and a magnetized rotor 8.

The heatsink 3 (FIGS. 1–6, 8, 11, 12 and 15–18) comprises a base 9 and upstanding heat exchanging means 10, the base 9 provides a thermal contact with the electronic components 2 and the heat exchanging means 10. According to the preferred embodiment the heat exchanging means 10 are fins 11 contacting with the base 9, both the fins 11 and the base 9 are made from high heat conductive material. It is preferably to make the fins 11 and the base 9 as a single unit. In this case it is possible to use well-known extrusion technology. It is also possible to make heat exchanging means 10 as pins or pins-fins structure (not shown). A cover plate 12 may be used like part of the heatsink 3 for covering of the heat exchanging means 10 thus forms heat exchanging channels 13. The base 9 provides direct contact with the electronic components 2 (FIGS. 3–4), or could comprise a heat spreading element 14 like heat pipe 15 (FIGS. 19–20) directly connected the base 9 and the electronic components 2 (not shown on FIGS. 19–20). In some cases the heat pipe 15 could serve as the base 9 of the heatsink 3.

The crossflow blower 5 comprised by arranging plural blades 16 in a columnar form to form a drum type impeller 17, and assembling a plurality of blades 16 in the direction of axis of rotation 18. Also, the crossflow blower 5 comprises a casing 19 rigidly built-in to the heatsink 3 (FIGS. 1–6). According to the preferred embodiment the casing 19 comprises an upper part 20 built-in to the cover plate 12 and a lower part 21 built-in to the base 9, thus forming a blower inlet 22 and a blower outlet 23 (FIGS. 1–4 and 6). The drum type impeller 17 comprises magnetic means 24 (will be described below) thus serving as the magnetized rotor 8.

The crossflow blower 5 is positioned on the side of the heatsink 3 (FIGS. 1–4 and 6) so that the axis of rotation 18 is closely parallel to the base 9 and the crossflow blower 5 hydraulically connected to one of the openings 4 or 4*a* (FIGS. 2–4 and 6).

There are two options for cooling gas flow directions. According to the first option (FIGS. 1A–4 and 6) the cooling gas flows through the opening 4, heat exchanging channels 13 flowing the heat exchanging means 10, the opening 4*a* that coincides with the blower inlet 22, the drum type impeller 17 and the blower outlet 23 in a series way. In this case the crossflow blower 5 hydraulically loaded by a suction side.

And, according to the second option (FIGS. 1A–4 and 6) the cooling gas flows through the blower inlet 22, the drum type impeller 17, the blower outlet 23 that coincides with the opening 4*a*, heat exchanging channels 13 flowing the heat exchanging means 10 and the opening 4 in a series way. In this case the crossflow blower 5 hydraulically loaded by a pressure side. It is known that crossflow blowers are more efficient when hydraulically loaded by the suction side, thus the first option for cooling gas flow direction is more preferable.

The drum type impeller 17 (FIGS. 1–4, 6–8 and 11–16) comprises two face disks 25 and 25*a* rigidly bounded with blades 16. The face disks 25 and 25*a* are mounted at bearings 26 located at the side of the heatsink 3. The cross flow blower 5 could also comprise guide vanes 27 usually used for increasing of the crossflow blower efficiency. In that case the guide vanes 27 are located inside the drum type impeller 17 and rigidly bound at the axis of rotation 18. When the heatsink 3 is relatively wide, the drum type impeller 17 is the same like most conventional impeller of elongated crossflow blowers, and comprises at least one interim ring 28 rigidly bound with the blades 16 to provide the rigidity of the drum type impeller 17. In this case the blades 16 are interrupted by the at least one interim ring 28 with some step angle in relation to the axis of rotation 18. The drum type impeller 17 on FIGS. 1, 1A, 2, 7, 19 and 20 comprises three interim rings 28.

The electric drive 6 (FIGS. 1–7, 11–13 and 18) comprises a stator 7 and a magnetized rotor 8. The stator 7 made as printed circuit board 29 and rigidly built-in to the casing 19.

According to the present invention the integrated crossflow cooler 1 for electronic components 2 comprises two types of the electric drives 6—the first embodiment (FIGS. 1–3, 5, 7, 9, 11–14, 18 and 21–24), when the magnetic means 24 magnetized in the direction parallel to the axis of rotation 18 and the second embodiment (FIGS. 1A, 4–6, 8, 15–18 and 25–26)—when the magnetic means 24 magnetized in the direction perpendicular to the axis of rotation 18. Both of these two types electric drives could be used mutually or separate, but mutual using is preferable.

According to the first embodiment of the electric drive 6 the drum type impeller 17 comprises the magnetic means 24 that are at least two blades of blades 16 and/or two face disks 25 and 25*a*, both magnetized in the direction parallel to the axis of rotation 18 thus the drum type impeller 17 serves as the magnetized rotor 8 of the electric drive 6. In this case the printed circuit board 29 comprises circumferential arrayed coils 30 mounted at the side of the casing 19 and located around the axis of rotation 18 and axes of the circumferential arrayed coils 30 are parallel to the axis of rotation 18. The circumferential arrayed coils 30 are operated by the controller 31 (FIGS. 1–3, 7, 9, 11–13 and 18).

For increasing of magnetic fields strength the magnetized rotor 8 may comprise additional magnetized rotors 32, 32*a*, 32*b* and 32*c* (FIGS. 1A, 2, 5, 7, 9, 12–14, 17, 18, 21, 22 and 24) magnetized in the direction parallel of the axis of rotation 18 and located on each side of the circumferential arrayed coils 30. The additional magnetized rotors 32*a* and 32*b* firmly connected to the face disks 25 and 25*a*. All additional magnetized rotors 32, 32*a*, 32*b* and 32*c* are manufactured like made of nonmagnetic material disks 33 with circumferentially arrayed permanent magnets 34 magnetized in the direction parallel of the axis of rotation 18. Screen plates 35 and 35*a* made of ferromagnetic material (FIGS. 1–2, 5–7, 12, 14, 17, 22 and 24) and placed from ended sides of the additional magnetized rotors 32 and 32*c* for closing of the magnetic field created by the magnetized rotor 8.

The operation and design of the first embodiment of the electric drive 6 in the present invention that uses circumferential arranged coils 30 are substantially similar as was described in the U.S. patent application Ser. No. 10/183,032 for BRUSHLESS DC ELECTRIC MOTOR for the same Assignee, which is hereby incorporated by this reference for all that disclosed therein.

According to the second embodiment of the electric drive 6 the drum type impeller 17 comprises the magnetic means 24 that are at least two blades 16 of the blades 16 and/or at least one interim ring 28 both magnetized in the direction perpendicular to the axis of rotation 18 thus the drum type impeller 17 serves as the magnetized rotor 8 of the electric drive 6. In this case the printed circuit board 29 has at least two rows of linear arrayed coils 36 and 36*a* mounted at the upper 20 and lower 21 parts of the casing 19 and located along the axis of rotation 18. The axes of the linear arrayed coils 36 and 36*a* are perpendicular to the axis of rotation 18. The controller 31 operates the linear arrayed coils 36 and 36*a*, like the circumferential arrayed coils 30 according to the first embodiment of the electric drive 6, too. The interim disk 28 may be made like permanent magnet magnetized in the direction perpendicular to the axis of rotation 18.

The design of the linear arrayed coils 36 and 36*a* of the stator 7 according to the second embodiment of the electric drive 6 are substantially similar as was described in the U.S. patent application Ser. No. 60/301,321 for DUAL AIR PATH COOLER, METHOD OF AND APPARATUS FOR COOLING ELECTRONIC DEVICES for the same Assignee, which is hereby incorporated by this reference for all that disclosed therein.

Figure 25:
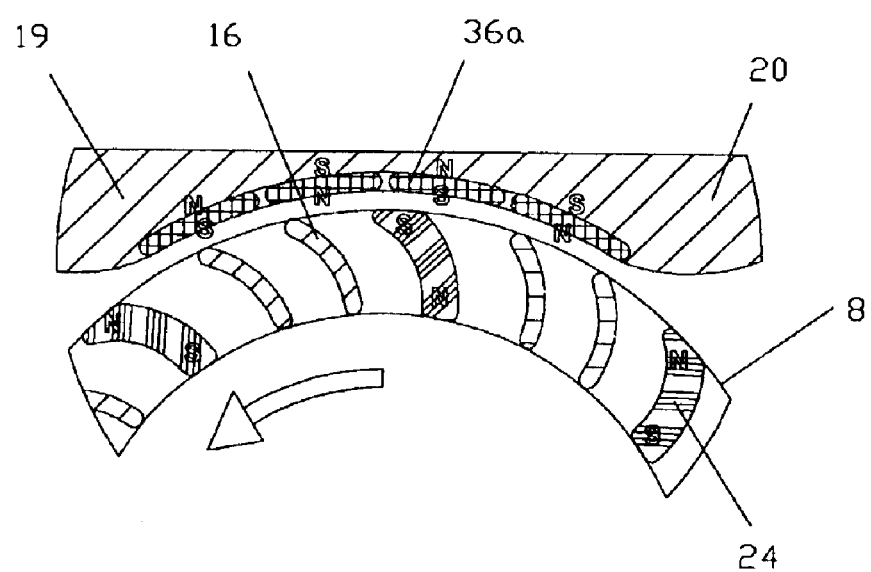
FIG. 25 is a principal scheme showing an electro magnetic interaction between the stator with linear arrayed coils and blades like part of the magnetized rotor.
Figure 26:
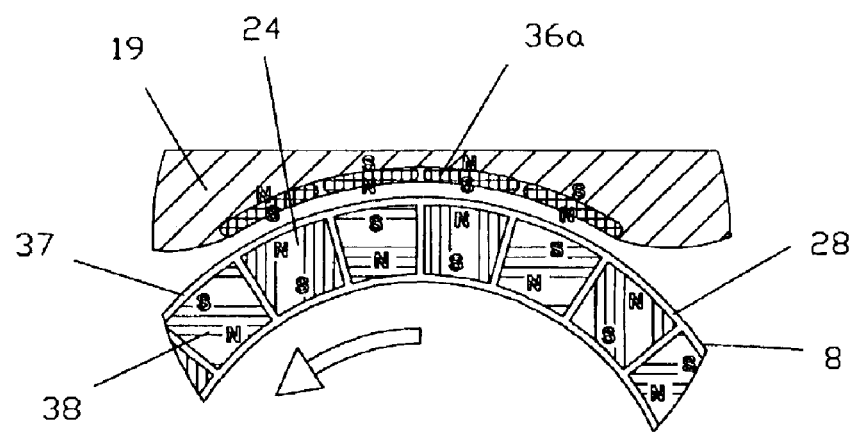
FIG. 26 is a principal scheme showing an electro magnetic interaction between the stator with linear arrayed coils and interim rings like part of the magnetized rotor.

The operation of the embodiment of the electric drive 6 in the present invention that uses linear arranged coils 36 and 36*a* (FIGS. 25, 26) is substantially similar to the operation according to the first embodiment of the electric drive 6 that uses circumferential arranged coils 30. The FIGS. 25 and 26 illustrate the electro magnetic interaction between the stator 7 with linear arrayed coils 36 and 36*a* and the magnetic means 24 like part of the magnetized rotor 8. FIG. 25 shows the design of the electric drive 6 when the magnetic means 24 are the blades 16 and the FIG. 26 shows the design of the electric drive 6 when the magnetic means 24 are the interim ring 28 manufactured like made of nonmagnetic material disks 37 with circumferentially arrayed permanent magnets 38 magnetized in the direction parallel of the axis of rotation 18.

The integrated crossflow cooler 1 for electronic components 2 operates in the following way. When an electric power supplied to the stator 7 of the electric drive 6, the alternative electro-magnetic field is created. This electromagnetic field controlled by the controllers 31 interacts with a magnetic field created by the magnetized rotor 8. In result of this interaction the magnetized rotor 8 and, therefore the drum type impeller 17 of the crossflow blower 5, is rotated in respect to the axis of rotation 18. Cooling gas starts moving and flows the heatsink 3. Heat generated by electronic components 2 transfers to the base 9 due its thermal contact and spread to the heat exchanging means 10. During cooling gas flows the heat exchanging means 10 the intensive process of heat exchange take place.

The total amount of heat taken away to ambient depends on the temperature difference between cooling gas and heat exchanging means 10, the surface coefficient of heat transfer and on surface of the heat exchanging means 10. It is evident that increasing of cooling gas at lower temperature results in increasing of the thermal efficiency of the integrated crossflow cooler 1 at other equal conditions.

The integrated crossflow cooler 1 for electronic components 2 according to the present invention has relatively high blower and thermal efficiency because the electric drive 6 is not located inside of the drum type impeller 17 thus allowed to locate inside the drum type impeller 17 the guide vanes 27 instead. These guide vanes 27 sufficiently increase the blower efficiency and, therefore the total amount of the cooling gas. In the same time such mounting of the guide vanes 27 does not require the need of increasing the total volume of the integrated crossflow cooler 1 for the electric drive 6 placements because all components of the electric drive 6 are integrated with drum type impeller 17 and the heatsink 3.

Figure 19:
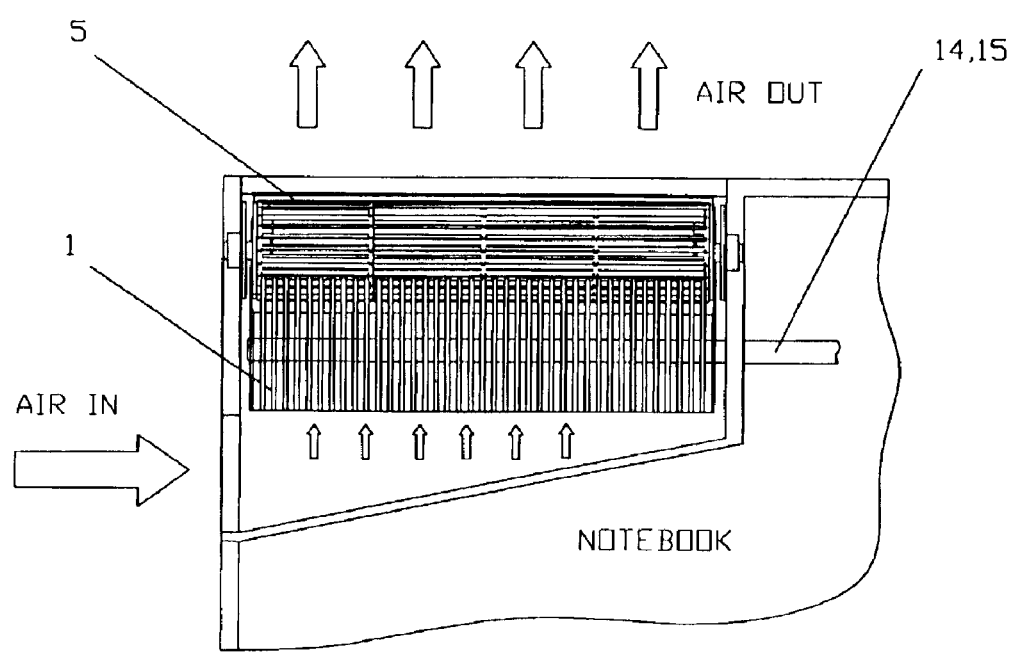
FIGS. 19 and 20 are top views showing the same design used for a notebook cooling.
Figure 20:
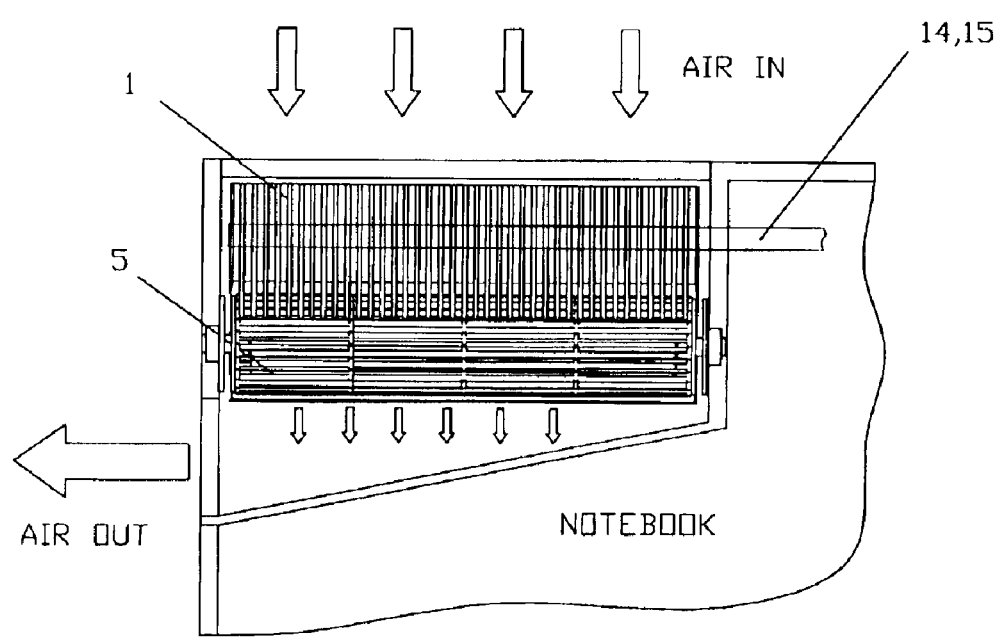
Figure 21:
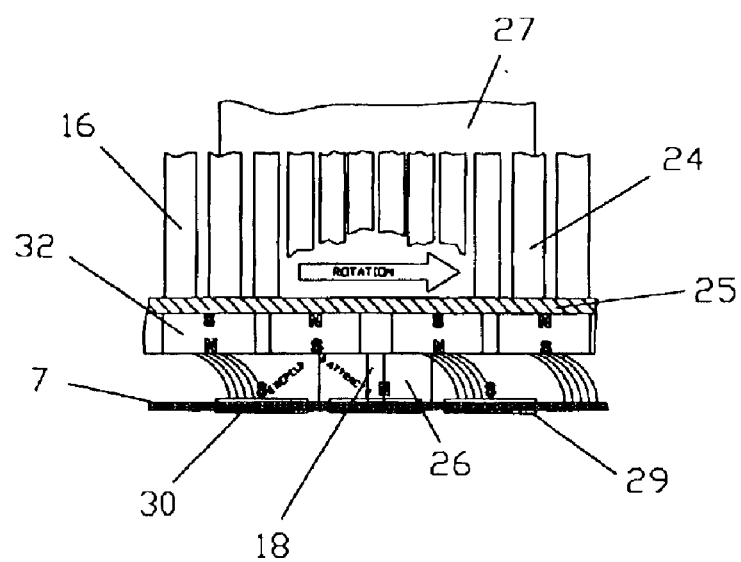
FIG. 21 is a principal scheme showing an electro magnetic interaction between the stator with the circumferential arrayed coils and face disk like part of the magnetized rotor.
Figure 22:
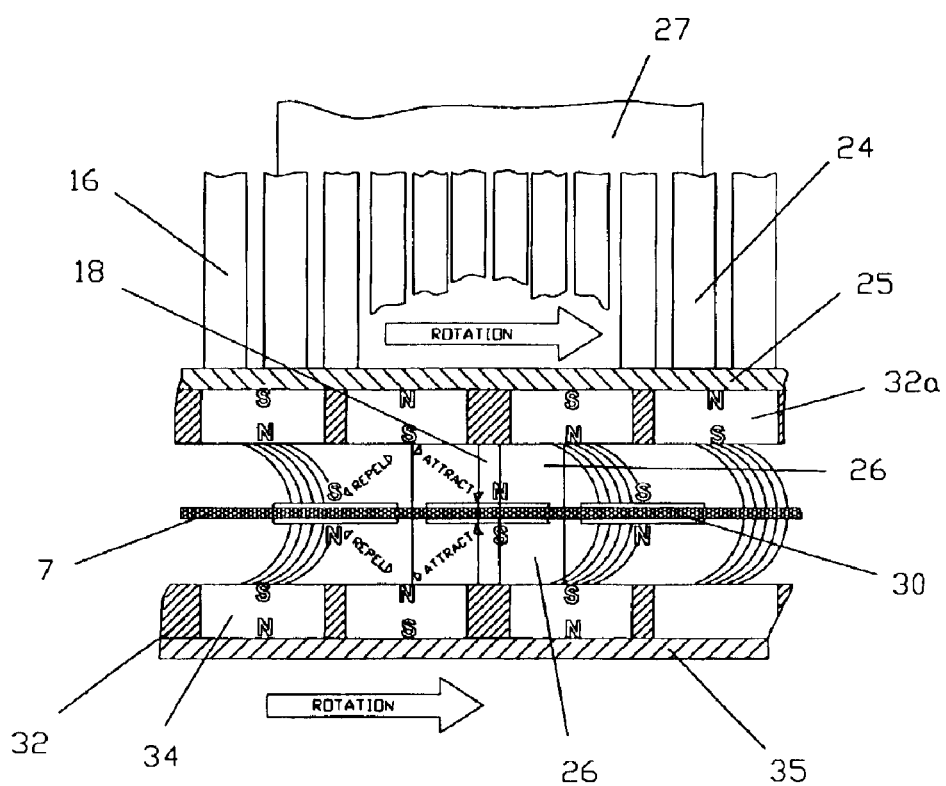
FIG. 22 is the same like FIG. 21 with the additional ended magnetic disk and the rotor plate.
Figure 23:
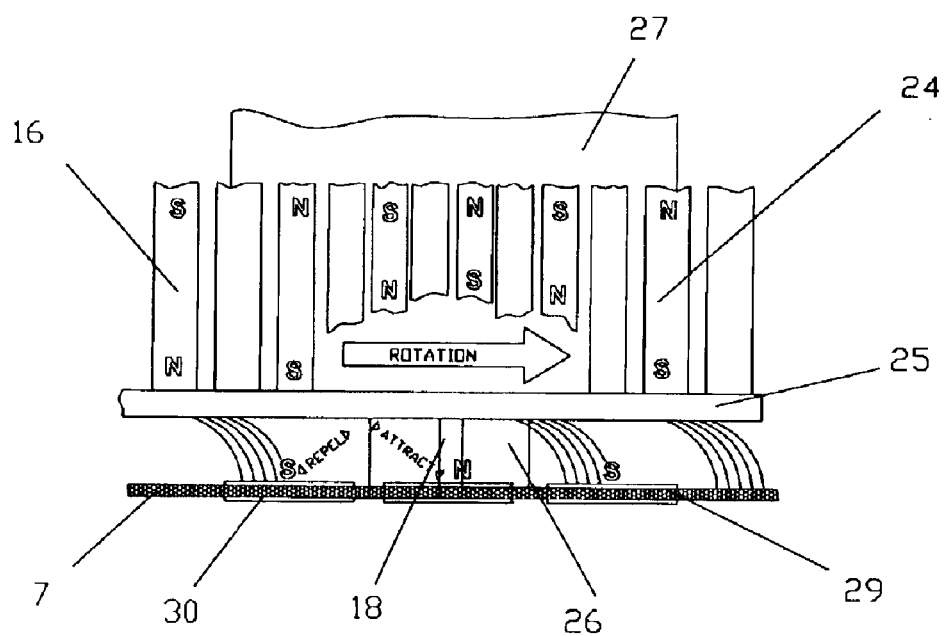
FIG. 23 is a principal scheme showing an electro magnetic interaction between the stator with the circumferential arrayed coils and blades like part of the magnetized rotor.
Figure 24:
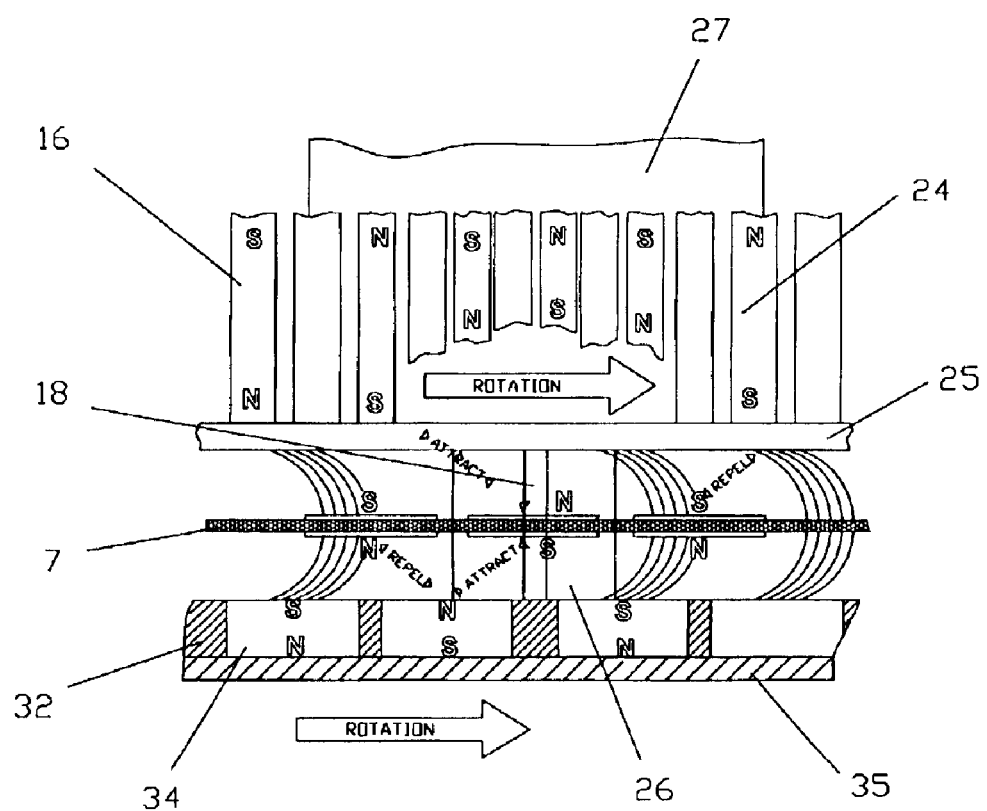
FIG. 24 is the same like FIG. 23 with the additional ended magnetic disk and the rotor plate.

The claimed invention can have another modification (FIGS. 19, 20). According to this embodiment, the integrated crossflow cooler 1 is placed in the devices with the strict space limitations, for example notebook computer or blade server. In such variation, the heat is delivered to the heatsink 3 from the electronic components (not shown) through the heat spreading element 14 like the heat pipe 15. In this case the heat pipe 15 could serve as the base 9 of the heatsink 3.

What has been described is merely illustrative of the principles of this invention according to which others skilled in the art may modify to generate other embodiments within the spirit and scope of the invention as encompassed by the following claims.

We claim:

1. An integrated crossflow cooler for electronic components comprising a heatsink with at least two openings, a crossflow blower and an electric drive with a stator and a magnetized rotor, wherein;
    (i) said heatsink comprising a base and upstanding heat exchanging means, said base providing thermal contact with said electronic component and said heat exchanging means;
    (ii) said crossflow blower hydraulically connected to one of said openings and comprising a casing rigidly built-in to said heatsink and a drum type impeller with an axis of rotation, said drum type impeller comprising magnetic means thus serving as a magnetized rotor of said electric drive;
    (iii) said stator made as printed circuit board and rigidly built-in to said casing.

2. The cooler as claimed in claim 1, wherein said heat exchanging means are fins and/or pins.

3. The cooler as claimed in claim 1, wherein said drum type impeller comprising at least two blades and/or two face disks both magnetized in the direction parallel to said axis of rotation and serving as said magnetic means.

4. The cooler as claimed in claim 3, wherein said printed circuit board comprising circumferential arrayed coils mounted at said casing and located around said axis of rotation and axes of said circumferential arrayed coils are parallel to said axis of rotation.

5. The cooler as claimed in claim 1, wherein said drum type impeller comprising at least two blades and/or at least one interim ring both magnetized in the direction perpendicular to said axis of rotation and serving as said magnetic means.

6. The cooler as claimed in claim 5, wherein said printed circuit board comprising at least two rows of linear arrayed coils mounted at said casing and located along said axis of rotation and axes of said linear arrayed coils are perpendicular to said axis of rotation.

* * * * *